US007982654B2

(12) United States Patent
Low

(10) Patent No.: US 7,982,654 B2
(45) Date of Patent: Jul. 19, 2011

(54) SMART SIGNAL JAMMER

(75) Inventor: Nathan E. Low, Liverpool, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 89 days.

(21) Appl. No.: 12/473,593

(22) Filed: May 28, 2009

(65) Prior Publication Data

US 2010/0302087 A1 Dec. 2, 2010

(51) Int. Cl.

| | |
|---|---|
| ***H03K 3/00*** | (2006.01) |
| ***G01S 7/38*** | (2006.01) |
| *G01S 7/02* | (2006.01) |
| *G01S 13/00* | (2006.01) |

(52) U.S. Cl. ................ 342/15; 342/13; 342/14; 342/82; 342/89; 342/175; 342/195; 455/1

(58) Field of Classification Search ............. 342/13–20, 342/82, 89, 90, 175, 195; 455/1
See application file for complete search history.

(56) References Cited

U.S. PATENT DOCUMENTS

| | | | | |
|---|---|---|---|---|
| 2,567,261 | A * | 9/1951 | Williams | 455/1 |
| 3,021,523 | A * | 2/1962 | Davis et al. | 342/13 |
| 3,600,685 | A | 8/1971 | Doyle | |
| 3,739,281 | A * | 6/1973 | Deserno et al. | 455/1 |
| 3,870,995 | A * | 3/1975 | Nielson | 342/14 |
| 3,879,732 | A * | 4/1975 | Simpson | 342/14 |
| 4,037,227 | A * | 7/1977 | Kline | 342/15 |
| 4,247,946 | A * | 1/1981 | Mawhinney | 455/1 |
| 4,264,909 | A * | 4/1981 | Hamilton et al. | 342/13 |
| 4,342,119 | A | 7/1982 | Seidl | |
| 4,357,709 | A | 11/1982 | Butler et al. | |
| 4,429,311 | A * | 1/1984 | Barewald | 342/15 |
| 4,498,193 | A | 2/1985 | Richardson | |
| 4,581,767 | A | 4/1986 | Monsen | |
| 4,584,694 | A | 4/1986 | Gumacos | |
| 4,682,172 | A * | 7/1987 | Kuhrdt | 342/15 |
| 4,689,622 | A * | 8/1987 | Kuhrdt | 342/14 |
| 4,697,157 | A | 9/1987 | Buddecke et al. | |
| 4,719,649 | A | 1/1988 | Woodsum et al. | |
| 4,743,905 | A * | 5/1988 | Wiegand | 342/14 |

(Continued)

FOREIGN PATENT DOCUMENTS

JP 02004304288 A 10/2004

(Continued)

OTHER PUBLICATIONS

Globalsecurity.Org, "AN/ALQ-99 Tactical Jamming System (TJS)", "http://www.globalsecurity.org/military/systems/aircraft/systems/an-alq-99.htm", May 14, 2009, Publisher: GlobalSecurity.org.

(Continued)

*Primary Examiner* — Bernarr E Gregory
(74) *Attorney, Agent, or Firm* — DeMont & Breyer, LLC

(57) ABSTRACT

A smart signal jammer is disclosed that receives a description of an unwanted signal or signals to be jammed, and transmits one or more jamming signals in one or more temporal transmission patterns of pulses that jam the unwanted signal or signals. A smart jammer according to the present invention can use available transmitters efficiently to transmit jamming pulses in a manner that maximizes jamming effectiveness. A smart jammer according to the present invention comprises a jamming signal calculator that calculates the parameters of the jamming signals to be transmitted. The calculations are based on inequalities that are satisfied by an efficient jamming signal.

23 Claims, 5 Drawing Sheets

U.S. PATENT DOCUMENTS

| | | | | |
|---|---|---|---|---|
| 5,583,509 | A | 12/1996 | Hynes et al. | |
| 5,671,247 | A | 9/1997 | Souissi et al. | |
| 5,822,429 | A | 10/1998 | Casabona et al. | |
| 6,112,052 | A | 8/2000 | Guthrie et al. | |
| 6,229,998 | B1 | 5/2001 | Hamdy et al. | |
| 6,297,762 | B1 | 10/2001 | Labitt | |
| 6,476,755 | B1 * | 11/2002 | Senio et al. | 342/15 |
| 6,933,877 | B1 * | 8/2005 | Halladay et al. | 342/14 |
| 6,970,415 | B1 | 11/2005 | Galarza et al. | |
| 6,975,673 | B1 | 12/2005 | Rouquette | |
| 7,095,779 | B2 * | 8/2006 | Karlsson | 455/1 |
| 7,099,369 | B2 | 8/2006 | Karlsson | |
| 7,126,979 | B2 * | 10/2006 | Karlsson | 455/1 |
| 2006/0264168 | A1 | 11/2006 | Corbett et al. | |
| 2006/0291540 | A1 | 12/2006 | Lee | |

FOREIGN PATENT DOCUMENTS

WO 2004086654 A1 10/2004

OTHER PUBLICATIONS

"https://onroutside.onr.navy.mil/aspprocessor/public__access/getdoc.asp?pid=3527054&dID=3609808", Sep. 18, 2007.

SULEKHAB2B, "http://www.sulekhab2b.com/ViewOffer/Product/56628/manpack-rcied-jammer.htm", May 14, 2009, Publisher: SulekhaB2B.

SULEKHAB2B, "http://www.sulekhab2b.com/ViewOffer/Product/13372/vsat-integrated-jamming-system.htm", May 14, 2009, Publisher: SulekhaB2B.

* cited by examiner

Method for jamming a high-baud signal 300

Method for jamming a low-baud signal 400

Method for generating a temporal transmission pattern 500

SMART SIGNAL JAMMER

FIELD OF THE INVENTION

The present invention relates to communication disruption in general, and, more particularly, to jamming unwanted communication.

BACKGROUND OF THE INVENTION

In the American Heritage Dictionary, third edition, one of the meanings reported for the verb "to jam" is: "to interfere with or prevent the clear reception of . . . signals . . . by electronic means." In this disclosure, the verb "jam" and its conjugated forms (e.g., "jammed," "jamming," "jammer," etc.) are used, in a somewhat broader sense, to mean: disrupting an unwanted signal of any kind (e.g., radio, optical, acoustic, electrical, etc.) by transmitting an interfering signal of a similar or related kind into the medium (e.g., radio channel or band, optical fiber, waveguide, audio channel or environment, cable or wire or transmission line, etc.) occupied by the unwanted signal, in such a way that the reception of the unwanted signal is disrupted, or prevented or, at least, impaired. Jamming unwanted, unauthorized or threatening communication signals is a technique that is commonly used by military personnel. For example, a jammer that overwhelms a radio channel with interference can be an effective defense against enemy communications in the battlefield. Indeed, disruption of unwanted radio signals is a common application of jamming techniques. Hereinafter this disclosure will use language frequently associated with radio communications and radio signals; however, such language should be understood to have a broader applicability to any kind of signal, as indicated above.

FIG. 1 is a schematic diagram of the salient components of an illustrative signal jammer in the prior art. It is labeled a "basic" signal jammer to highlight the simple architecture of signal jammers that is common in the prior art. Basic signal jammer 100 comprises: receiver 110, transmitter 111-1, transmitter 111-2, and transmitter 111-3, interconnected as shown.

Receiver 110 is a device that receives a description 101 of signals to be transmitted, and converts that description into parameters of jamming signals to be transmitted (hereinafter, "jamming-signal parameters"). Receiver 110 conveys the values of the jamming-signal parameters to transmitters 111-1, 111-2, and 111-3.

Transmitters 111-1, 111-2, and 111-3 transmit jamming signals 102-1, 102-2, and 102-3, respectively. Each signal can be transmitted in a different band, and different signals can be transmitted in different bands at different points in time. In particular, each transmitter can transmit a short burst (hereinafter "pulse") of interfering signal in one band and, immediately afterwards, transmit another pulse in another band, and so on, in a pattern that is usually repeated periodically in time (hereinafter "temporal transmission pattern"). The specific parameters of the temporal transmission patterns to be transmitted by the three transmitters are provided by description 101 and are incorporated into the jamming-signal parameters by receiver 110.

In typical prior-art jammers, the selection of parameters for the temporal transmission patterns is performed by a human operator of basic signal jammer 100. The human operator usually knows one or more characteristics of the signal, or signals to be jammed, and, based on his or her experience and skill, can generate parameters for the temporal transmission patterns so as to achieve an effective jamming of the unwanted signals.

SUMMARY OF THE INVENTION

The present invention enables a signal jammer that avoids some of the costs and disadvantages of signal jammers in the prior art. For example, an embodiment of the present invention is a "smart" signal jammer that receives a description of an unwanted signal or signals to be jammed, (in contrast to basic jammer 100 in the prior art, which receives a description of signals to be transmitted) and transmits one or more jamming signals in one or more temporal transmission patterns of pulses that jam the unwanted signal or signals.

Furthermore, a smart jammer according to the present invention can improve the efficiency with which available transmitters are used to transmit jamming pulses, thus reducing the number of transmitters needed by the smart jammer, compared to a prior-art jammer.

A smart jammer according to the present invention comprises a jamming signal calculator that calculates the parameters of the jamming signals to be transmitted. The calculations are based on inequalities that are satisfied by an efficient jamming signal. An embodiment of the present invention comprises a method of generating jamming-signal parameters that satisfy the inequalities. Therefore, the jamming signals transmitted by a smart jammer according to the present invention can efficiently and effectively jam the signals whose description is provided to the smart jammer.

DETAILED DESCRIPTION

Figure 1:
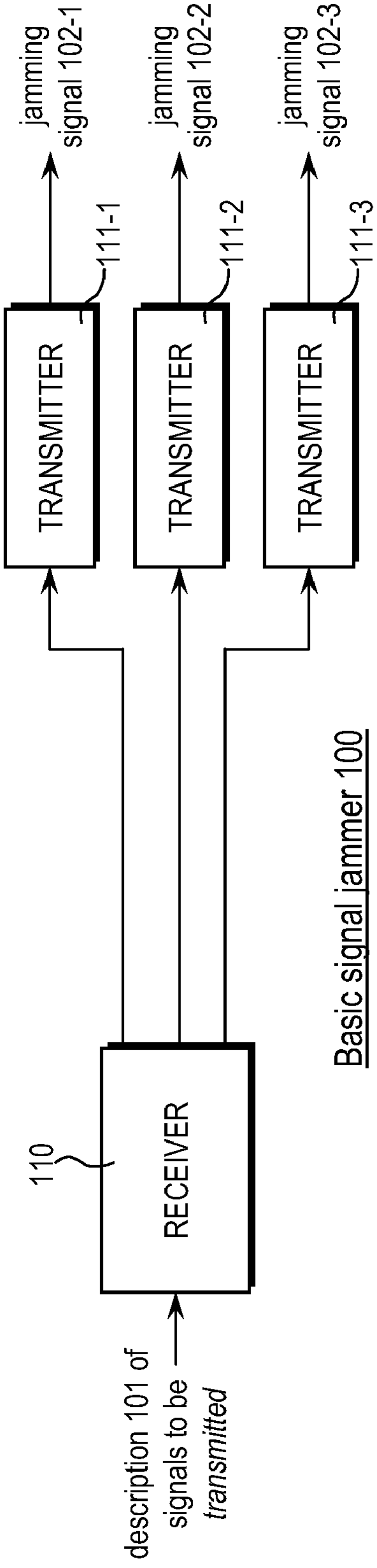
FIG. 1 PRIOR ART
FIG. 1 is a schematic diagram of the salient components of an illustrative signal jammer in the prior art.
Figure 2:
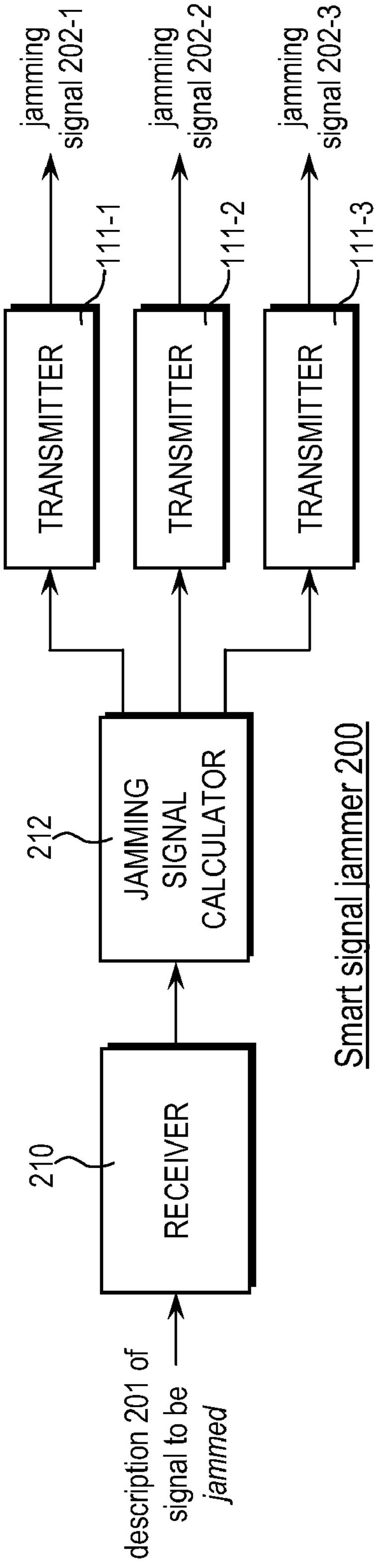
FIG. 2 is a schematic diagram of the salient components of smart signal jammer 200 in accordance with an illustrative embodiment of the present invention.

FIG. 2 is a schematic diagram of the salient components of smart signal jammer 200 in accordance with an illustrative embodiment of the present invention. Smart signal jammer 200 comprises: receiver 210, jamming signal calculator 212, transmitter 111-1 through transmitter 111-3, interconnected as shown.

Although the illustrative embodiment comprises three transmitters, it will be clear to those skilled in the art, after reading this disclosure, how to make and use alternative embodiments of the present invention that comprise one, two, or more than three transmitters.

Receiver 210 is a device that receives a description 201 of a signal to be jammed, (in contrast to receiver 110, which receives description 101 of signals to be transmitted) and converts that description into a format that can be used by jamming signal calculator 212. Although receiver 210 receives one description of a signal, it will clear to those skilled in the art, after reading this disclosure, how to make and use alternative embodiments of the present invention which receive:

i. a description of a plurality of signals, or
ii. a plurality of descriptions, each of which is of one or more signals, or
iii. a combination of i and ii.

Description 201 can be provided in a variety of ways. For example, and without limitation, description 201 can be provided through:

i. knobs, switches and pushbuttons set by a human operator, or
ii. a graphical user interface implemented through one or more digital or analog displays, or
iii. a graphical user interface implemented through a general-purpose computer, or
iv. a mouse, or a trackball, or a stylus, or any other graphical input device, or
v. a text-entry device, or a numerical-entry device such as a keyboard or a keypad, or
vi. a voice-entry system, or
vii. a data cartridge, disk, module, memory, or other storage device containing the description, or
viii. a radio signal modulated with data that convey the description, or
ix. any kind of signal that can be used to convey data (e.g., sound, infrared, electrical, etc.), or
x. any combination of i, ii, iii, iv, v, vi, vii, viii, and ix.

It will be clear to those skilled in the art, after reading this disclosure, how to make and use alternative embodiments of the present invention in which the description is provided through one of the methods listed above, or through other methods for conveying data.

Description 201 can comprise elements that specify various characteristics (hereinafter "parameters") of the signal or signals to be jammed. Such parameters can be specified as unique values, or they can be specified as sets or ranges. For example, and without limitation, they can be exact numerical values or ranges of numerical values. In an illustrative embodiment of the present invention, description 201 comprises a range of baud values and a specification of frequency bands in which the signal to be jammed can exist. A range of baud values can be specified as an uninterrupted range extending from a minimum baud value, $R_{min}$, to a maximum baud value, $R_{max}$. The specification of frequency bands can comprise the number of frequency bands, B, and also comprise identifiers to uniquely identify the frequency bands. Hereinafter, the frequency bands will be denoted by integers from 1 to B. It will be clear to those skilled in the art, after reading this disclosure, how to make and use alternative embodiments of the present invention which utilize other methods of, or formats for specifying baud ranges and frequency bands, or other parameters of the signal, or signals to be jammed.

The use of baud values to characterize the signal to be jammed implies that the signal is digital. In particular, it is well known in the art that baud is a unit of measure of symbol rate in digital communication systems, with 1 baud corresponding to 1 symbol/second. Therefore, the range of baud values from $R_{min}$ to $R_{max}$ specifies that the symbol rate of the signal to be jammed can be anywhere within that range.

Jamming signal calculator 212 accepts, from receiver 210, a converted version of description 201. In an illustrative embodiment of the present invention, receiver 210 converts description 201 into electronic data, and jamming signal calculator 212 is implemented as an electronic computer; however, it will be clear to those skilled in the art, after reading this disclosure, how to make and use alternative embodiments of the present invention which use other implementations of jamming signal calculator 212.

Jamming signal calculator 212 generates jamming-signal parameters and conveys them to transmitters 111-1, 111-2, and 111-3, which transmit jamming signals 202-1, 202-2, and 202-3, respectively, based on the jamming-signal parameters. These transmitters are the same as transmitters 111-1, 111-2, and 111-3 used in prior-art jammer 100; however, jamming signals 202-1, 202-2, and 202-3 are different from jamming signals 102-1, 102-2, and 102-3 because they are based on the jamming-signal parameters calculated by jamming signal calculator 212.

Figure 3:
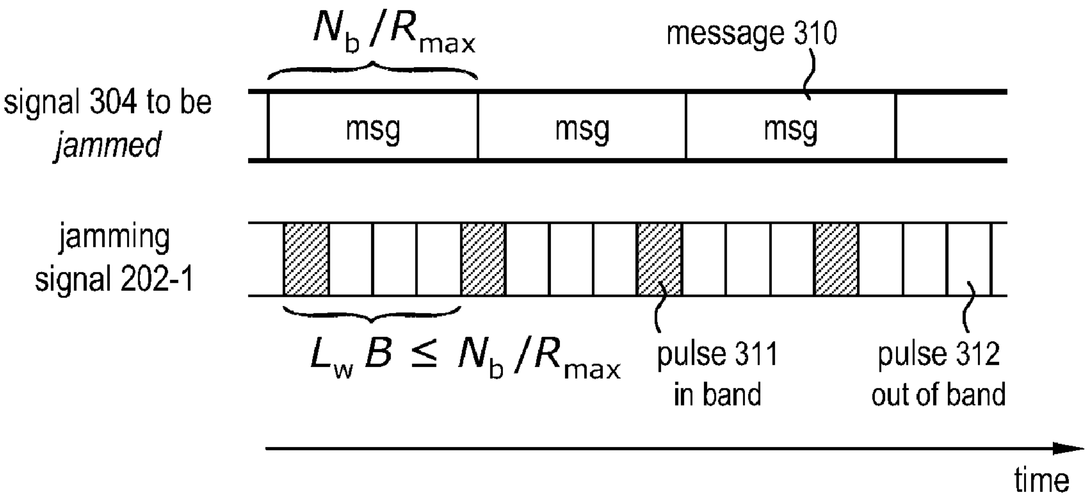
FIG. 3 depicts a method for using jamming signal 202-1 to jam an unwanted signal 304 that is transmitted at the maximum symbol rate, $R_{max}$, specified by description 201.
Figure 4:
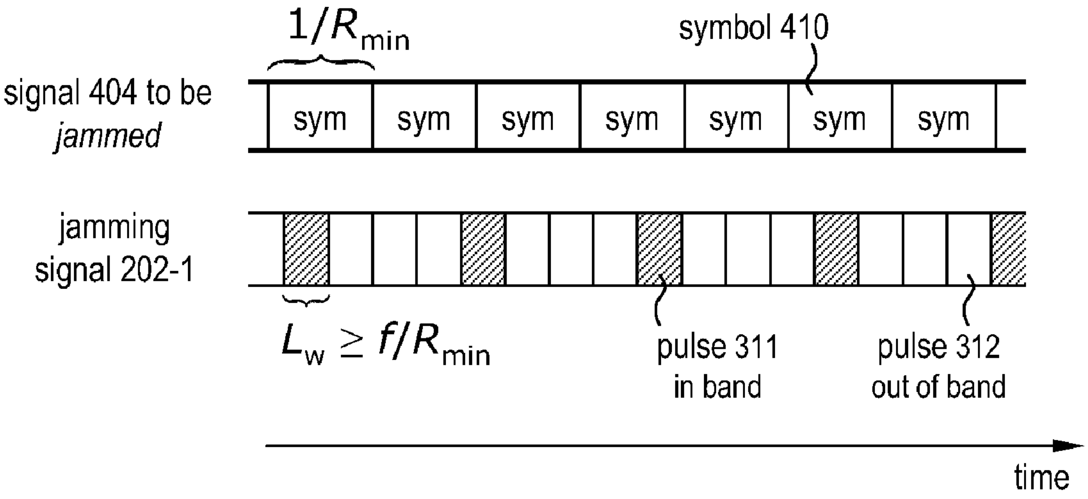
FIG. 4 depicts a method for using jamming signal 202-1 to jam an unwanted signal 404 that is transmitted at the minimum symbol rate, $R_{min}$, specified by description 201.

Jamming signal calculator 212 calculates the jamming-signal parameters based on several constraints that can be expressed as inequalities that involve the jamming-signal parameters in combination with elements of description 201. These inequalities are devised such that, when satisfied, jamming signal 202 is an effective jamming signal. FIG. 3 and FIG. 4 illustrate how such inequalities are derived.

FIG. 3 depicts a method for using jamming signal 202-1 to jam an unwanted signal 304 that is transmitted at the maximum symbol rate, $R_{max}$, specified by description 201. Signal 304 is structured as a sequence of digital messages 310, wherein each message 310 is a sequence of digital symbols. Accordingly, description 201 can further comprise, in addition to the three elements $R_{min}$, $R_{max}$, and B already mentioned, also a minimum number of symbols, $N_b$, that each message is known to contain (also referred to as the minimum length of a message).

FIG. 3 shows that jamming signal 202-1 comprises a short pulse 311 of jamming energy transmitted in the band where signal 304 exists. The short pulse 311 is represented by a shaded rectangle in FIG. 3, and is repeated at periodic intervals; the time duration of pulse 311 is denoted the parameter $L_w$ (which is an abbreviation of "window length"). In between repetitions of pulse 311, jamming signal 202-1 comprises other pulses 312, represented by white rectangles in FIG. 3, that are transmitted in other frequency bands in order to jam unwanted signals that might exist in those bands. All pulses have the same duration, $L_w$, and to jam all the bands specified by description 201, the total number of transmitted pulses is B. Accordingly, the repetition period of pulse 311 is $L_wB$.

In modern digital communications, error-correction techniques enable a signal to tolerate errors, up to a certain extent. Accordingly, description 201 can further comprise an indication of the extent to which message 310 can tolerate errors. In particular, description 201 can comprise an element, $N_o$, that is the minimum number of symbols of message 310 that must be overlapped by pulse 311 (also referred to as the minimum size of a portion of the message, the portion to be overlapped by the second signal). For example, a value of $N_o$ can be computed from the probability, $P_o$, that the presence of pulse 311 will cause a symbol error, and from the maximum number, $N_e$, of symbol errors that message 310 can tolerate, as $N_o=\lceil (N_e+1)/P_o \rceil$.

To insure that the required number of symbols, $N_o$, is overlapped by pulse 311, the inequality $L_w \geqq N_o/R_{max}$ must be satisfied. To insure that at least one pulse 311 occurs during each message 310, the repetition period of pulse 311 must be no greater than the duration of message 310; i.e., the inequality $L_wB \leqq N_b/R_{max}$ must be satisfied.

FIG. 4 depicts a method for using jamming signal 202-1 to jam an unwanted signal 404 that is transmitted at the minimum symbol rate, $R_{min}$, specified by description 201. As in FIG. 3, signal 202-1 comprises a sequence of pulses 311 transmitted in the band where signal 404 exists. FIG. 4 shows a sequence of individual digital symbols 410 from signal 404. Each pulse 311 overlaps only a fraction of a symbol 410; if that fraction is too small, the pulse will not succeed in jamming the symbol. How small is too small depends on the details of the modulation scheme used by signal 404; accordingly, description 201 can further comprise a minimum fraction, f, of a symbol, the minimum fraction to be overlapped by pulse 311. For pulse 311 to overlap the minimum fraction, f, of symbol 410, the inequality $L_w \geqq f/R_{min}$ must be satisfied.

As was true for signal 304, it is necessary that $N_o$ symbols be jammed in a message; i.e., there must occur at least $N_o$ repetitions of pulse 311 within the time interval occupied by a message. This requirement means that the inequality $L_w B \leqq N_b/(R_{min} N_o)$ must be satisfied. Table I lists the four inequalities that must be satisfied. Table II summarizes the definitions of the variables appearing in the inequalities.

TABLE I

| inequalities |
|---|
| $L_w B \leqq N_b/R_{max}$ |
| $L_w \geqq N_o/R_{max}$ |
| $L_w \geqq f/R_{min}$ |
| $L_w B \leqq N_b/(R_{min} N_o)$ |

If a value for $L_w$ exists that satisfies all four inequalities, signal 202-1 is sufficient, by itself, to jam any signal that fits description 201. In this case, jamming signal calculator 212 can set the jamming-signal parameters such that transmitters 111-2 and 111-3 are turned off, while transmitter 111-1 is configured to transmit a periodic temporal transmission pattern of pulses of duration $L_w$ in the B bands specified by description 201.

TABLE II

| variables | |
|---|---|
| $R_{min}$ | minimum baud value of signal to be jammed |
| $R_{max}$ | maximum baud value of signal to be jammed |
| B | number of frequency bands to be jammed |
| $N_b$ | minimum number of symbols in a message to be jammed |
| $L_w$ | time duration of jamming pulse |
| $N_o$ | minimum number of symbols to be overlapped |
| f | minimum fraction of a symbol to be overlapped |

Figure 5:
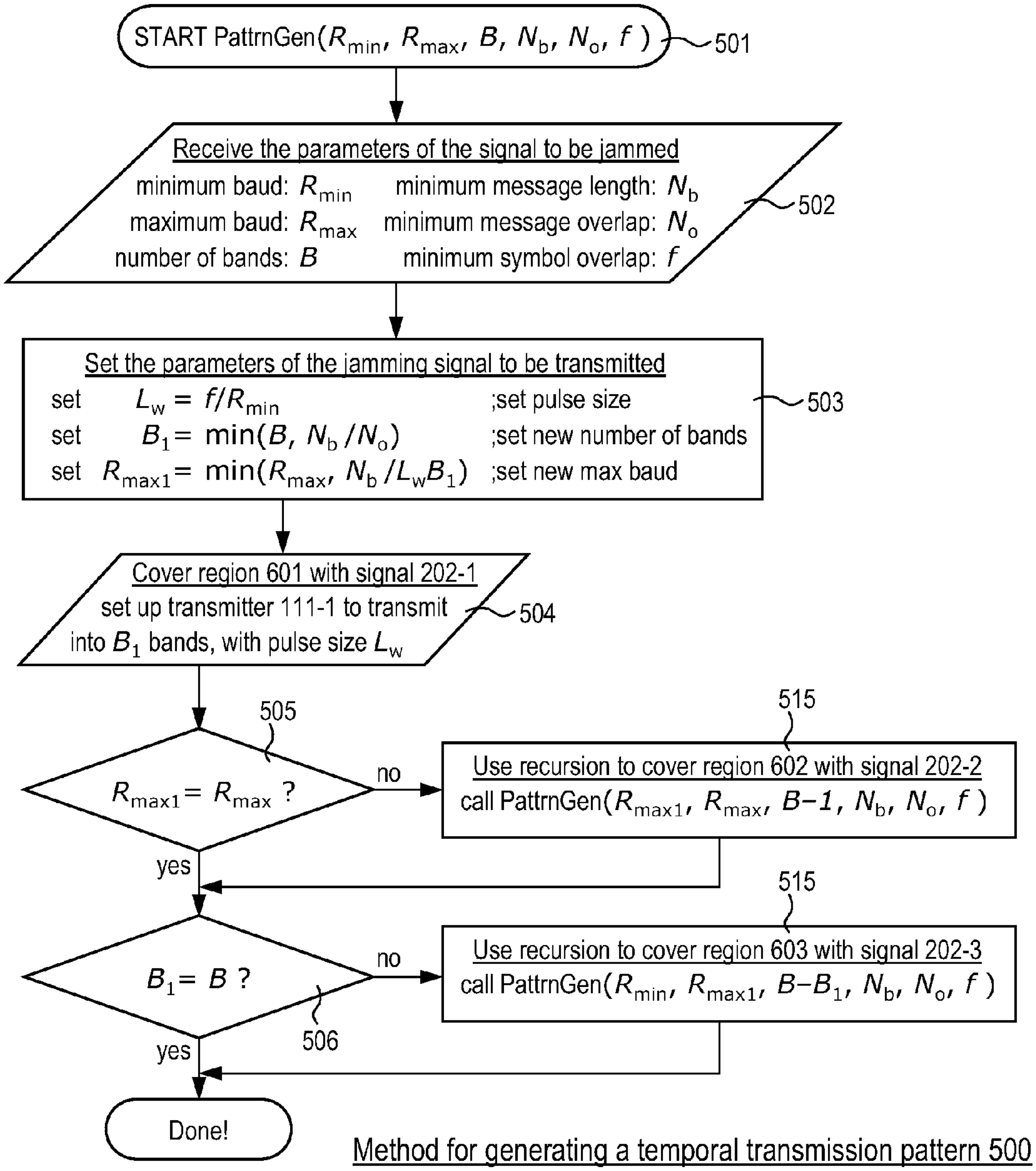
FIG. 5 is a flowchart of the salient tasks for generating jamming-signal parameters according the illustrative embodiment.

FIG. 5 is a flowchart of the salient tasks for generating jamming-signal parameters according the illustrative embodiment. In method 500, a value for $L_w$ that satisfies all four inequalities is found. If necessary, method 500 finds modified values $B_1$ for B, and $R_{max1}$ for $R_{max}$, that allow it to find such a value, wherein $B_1 \leqq B$ and $R_{max1} \leqq R_{max}$. Jamming signal calculator can use method 500 to generate jamming-signal parameters to configure transmitter 111-1 such that jamming signal 202-1 jams signals that can exist in $B_1$ bands with a symbol rate between $R_{min}$ and $R_{max1}$. If $B_1$=B and $R_{max1}=R_{max}$, this is the case mentioned in paragraph [0032] wherein signal 202-1 is sufficient, by itself, to jam any signal that fits description 201. Otherwise, method 500 calls itself recursively, to generate additional jamming-signal parameters to configure transmitters 111-2 and 111-3, such that signals 202-1, 202-2 and 202-3, in combination, jam any signal that fits description 201. Although this example illustrates how to generate jamming-signal parameters for three transmitters, it will be clear to those skilled in the art, after reading this disclosure, how to make and use alternative embodiments of the present invention wherein method 500 calls itself recursively additional times in order to generate jamming-signal parameters for additional transmitters.

Figure 6:
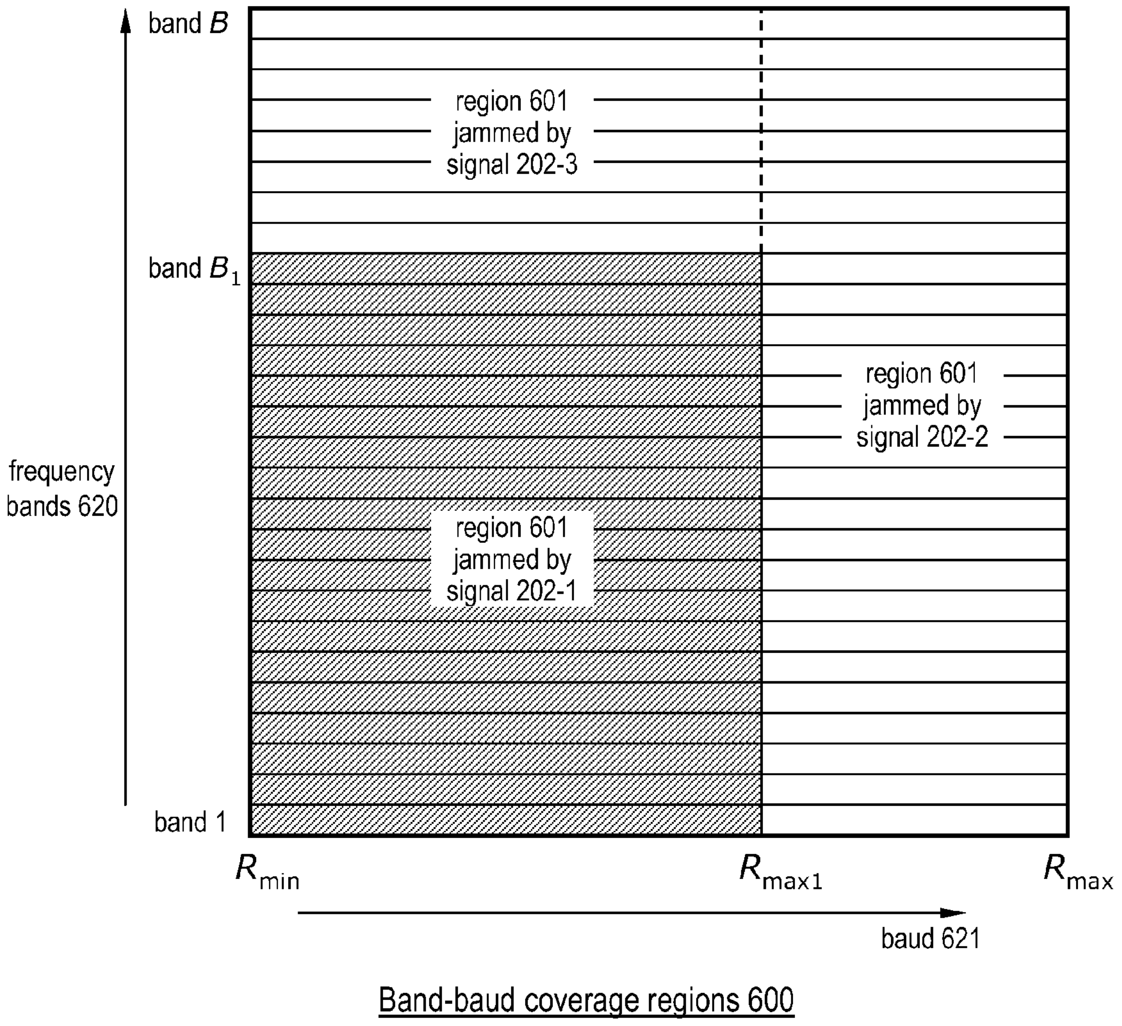
FIG. 6 is a diagram that illustrates how method 500 works on an example signal description 201.

FIG. 6 is a diagram that illustrates how method 500 works on an example signal description 201. Region 601 represents the signals that are jammed by signal 202-1 when $B_1$<B and $R_{max1}<R_{max}$ (i.e., the first use of method 500 "covers" region 601). Regions 602 and 603, together, represent all the signals that fit description 201 but that are not jammed by signal 202-1. Because regions 602 and 603 are rectangular in shape—the same shape as the region defined by description 201—jamming signal calculator 212 can use method 500 again to cover each of these two regions. In particular, method 500 is used again twice, once for region 602 and once for region 603, to generate jamming-signal parameters for signals 202-2 and 202-3, respectively. It will be clear to those skilled in the art, after reading this disclosure, how to make and use alternative embodiments of the present invention that comprise more than three transmitters and in which method 500 is used again, recursively, to generate additional jamming-signal parameters for the additional transmitters.

Figure 7:
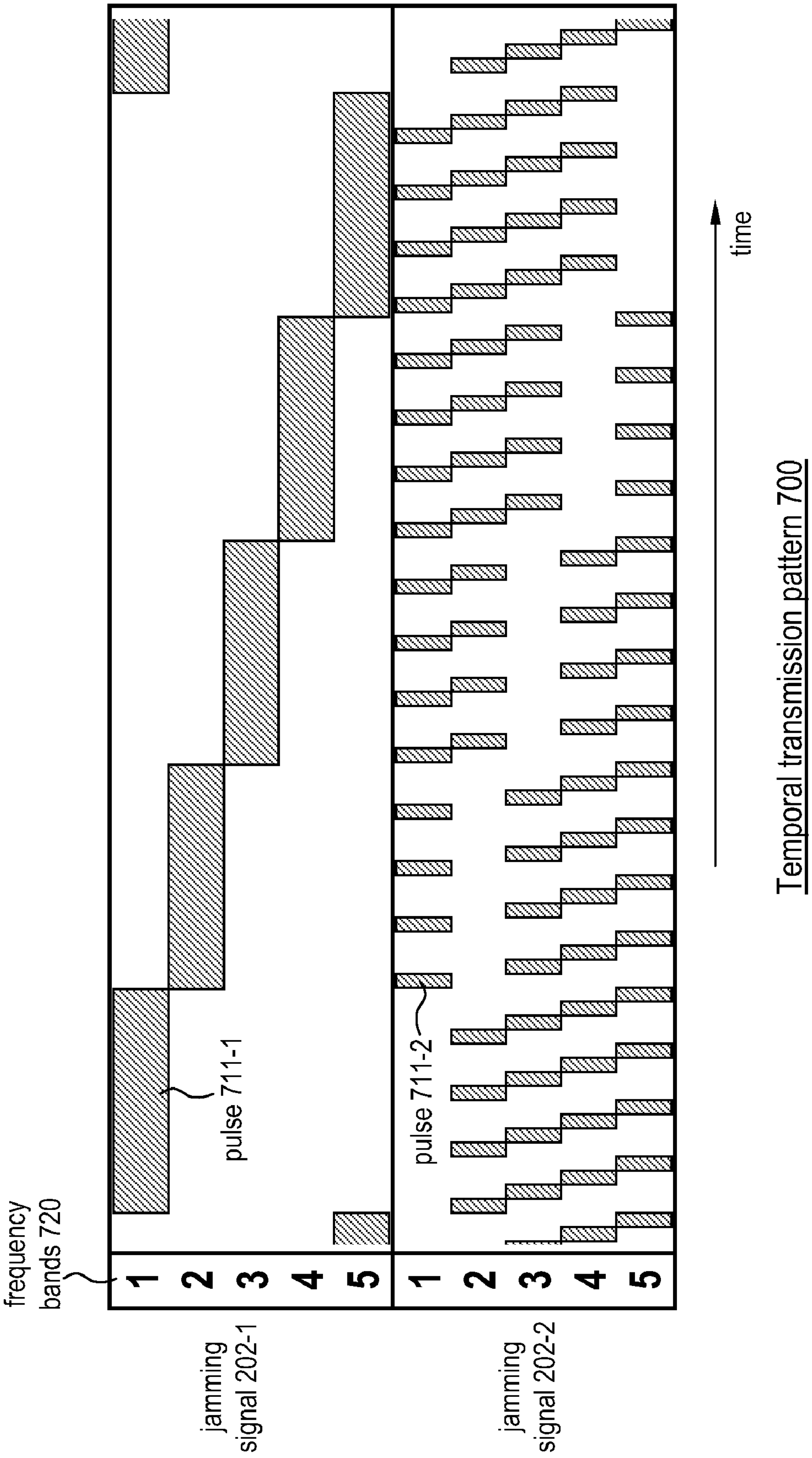
FIG. 7 is a diagram of an example of temporal transmission patterns transmitted by smart signal jammer 200.

The recursive feature of method 500 is accomplished by tasks 515 and 516. Task 515 covers region 602, and task 516 covers region 603; however, in task 515, the recursive call to method 500 uses the value B−1 for the number of bands, instead of the value B, even though, according to FIG. 6, B is the number of bands that region 602 comprises. This is because, at any instant in time, signal 202-1, which covers region 601, is transmitting a pulse in some band and, therefore, there are only B−1 bands remaining that do not already contain a jamming signal. There is no need for transmitter 111-2 to transmit a jamming pulse in a band where another transmitter (in this case, transmitter 111-1) is already transmitting a jamming pulse. The temporal transmission pattern of pulses comprised by signal 202-2 is repeated periodically only over the B−1 bands available at any given time. In particular, at the instant in time when a new transmission pulse is to begin, the new transmission pulse is placed in the next available transmission band; i.e., it is placed in the next band that is unoccupied at that instant in time. FIG. 7 illustrates the resulting pattern.

FIG. 7 is a diagram of an example of temporal transmission patterns transmitted by smart signal jammer 200. In particular, temporal transmission patterns 700, as depicted in FIG. 7, are for an illustrative embodiment of the present invention wherein B=5, and the first use of method 500 yields $B_1$=B and $R_{max1}<R_{max}$. In this case, only signals 202-1 and 202-2 are required for jamming. The top half of the diagram in FIG. 7 shows the temporal transmission pattern of signal 202-1; the bottom half of the diagram shows the temporal transmission pattern of signal 202-2. Individual pulses are shown as shaded rectangles such as pulse 711-1, which is for signal 202-1, and pulse 711-2, which is for signal 202-2. The pulses of signal 202-1 are transmitted sequentially in each of the five bands specified by description 201, and then repeat periodically. The pulses of signal 202-2 are transmitted sequentially in each of the four remaining band, and then repeat periodically among the four bands that remain unoccupied by signal 202-1 at any given time. It will be clear to those skilled in the art, after reading this disclosure, how to make and use alternative embodiments of the present invention wherein method 500 is used to generate temporal transmission patterns for a different number of signals, or a different number of bands, or a combination of both.

The flowchart provided in FIG. 5 is intended for illustrative purposes. It will be clear to those skilled in the art, after reading this disclosure, how to make and use embodiments of the present invention wherein method 500 is implemented through other tasks, or is implemented through software, firmware or hardware, including all the details necessary to insure its proper execution and termination. For example, and without limitation, an embodiment of method 500 can include a termination test wherein the method terminates if it is called with B=0, or with $R_{min}=R_{max}$. It will also be clear to those skilled in the art, after reading this disclosure, how to make and use embodiments of the present invention wherein other methods are used to achieve jamming-signal parameters for one or more transmitted signals that satisfy all or some of the inequalities.

It is to be understood that this disclosure teaches just one or more examples of one or more illustrative embodiments, and that many variations of the invention can easily be devised by those skilled in the art after reading this disclosure, and that the scope of the present invention is to be determined by the following claims.

What is claimed is:

1. An apparatus comprising:

a receiver for receiving a description of a first signal to be jammed, wherein the description comprises:

(i) a minimum baud value, $R_{min}$, of the first signal, (ii) a maximum baud value, $R_{max}$, of the first signal, and (iii) a specification of frequency bands in which the frequency of the first signal can lie, wherein the number of frequency bands is B;

a first transmitter for transmitting a second signal to jam the first signal, wherein (a) the frequency of transmission of the second signal is based on the minimum baud value $R_{min}$, of the first signal, on the maximum baud value $R_{max}$, of the first signal, and on the specification of frequency bands in which the frequency of the first signal can lie;

(b) the second signal is transmitted into one of the frequency bands at a time; and (c) the second signal is transmitted into different frequency bands at different times according to a first temporal transmission pattern that is based on $R_{min}$, $R_{max}$, and B;

wherein B is an integer greater than 1; and wherein $R_{min}$ and $R_{max}$ are positive real numbers and $R_{min}<R_{max}$.

2. The apparatus of claim 1 further comprising:

a second transmitter for transmitting a third signal to jam the first signal, wherein the third signal is transmitted into one of the frequency bands at a time, and wherein the third signal is transmitted into different frequency bands at different times according to a second temporal transmission pattern that is based on $R_{min}$, $R_{max}$, B, and on the first temporal transmission pattern.

3. The apparatus of claim 1 wherein the description further comprises:

(iv) a minimum length, $N_b$, of a message that is part of the first signal, and (v) a minimum size, $N_o$, of a portion of the message, the portion to be overlapped by the second signal;

wherein the first temporal transmission pattern is also based on $N_b$ and $N_o$.

4. The apparatus of claim 3 wherein a duration, $L_w$, of an uninterrupted interval of time that the second signal spends in a frequency band as part of the first temporal transmission pattern, satisfies the inequality $L_wB \leqq N_b/R_{max}$.

5. The apparatus of claim 3 wherein a duration, $L_w$, of an uninterrupted interval of time that the second signal spends in a frequency band as part of the first temporal transmission pattern, satisfies the inequality $L_w \geqq N_o/R_{max}$.

6. The apparatus of claim 3 wherein a duration, $L_w$, of an uninterrupted interval of time that the second signal spends in a frequency band as part of the first temporal transmission pattern, satisfies the inequality $L_wB \leqq N_b/(R_{min} N_o)$.

7. The apparatus of claim 3 wherein the description further comprises:

(vi) a minimum fraction, f, of a symbol, the minimum fraction to be overlapped by the second signal;

wherein the first temporal transmission pattern is also based on f.

8. The apparatus of claim 7 wherein a duration, $L_w$, of an uninterrupted interval of time that the second signal spends in a frequency band as part of the first temporal transmission pattern, satisfies the four inequalities: $L_wB \leqq N_b/R_{max}$; $L_w \geqq N_o/R_{max}$; $L_w \geqq f/R_{min}$; $L_wB \leqq N_b/(R_{min} N_o)$.

9. The apparatus of claim 7 wherein a duration, $L_w$, of an uninterrupted interval of time that the second signal spends in a frequency band as part of the first temporal transmission pattern, satisfies the four inequalities: $L_wB_1 \leqq N_b/R_{max1}$; $L_w \geqq N_o/R_{max1}$; $L_w \geqq f/R_{min1}$; $L_wB_1 \leqq N_b/(R_{min1} N_o)$;

wherein the three parameters $R_{min1}$, $R_{max1}$, and $B_1$ satisfy the inequalities: $R_{min} \leqq R_{min1} \leqq R_{max1} \leqq R_{max}$ and $1 \leqq B_1 \leqq B$.

10. The apparatus of claim 1 wherein the description further comprises:

(iv) a minimum fraction, f, of a symbol, the minimum fraction to be overlapped by the second signal;

wherein the first temporal transmission pattern is also based on f.

11. The apparatus of claim 10 wherein a duration, $L_w$, of an uninterrupted interval of time that the second signal spends in a frequency band as part of the first temporal transmission pattern, satisfies the inequality $L_w \geqq f/R_{min}$.

12. A method comprising:

receiving a description of a first signal to be jammed, wherein the description comprises:

(i) a minimum baud value, $R_{min}$, of the first signal, (ii) a maximum baud value, $R_{max}$, of the first signal, and (iii) a specification of frequency bands in which the frequency of the first signal can lie, wherein the number of frequency bands is B;

generating a first temporal transmission pattern that is based on $R_{min}$, $R_{max}$, and B;

transmitting a second signal for jamming the first signal, wherein (a) the frequency of transmission of the second signal is based on the minimum baud value $R_{min}$, of the first signal, on the maximum baud value $R_{max}$, of the first signal, and on the specification of frequency bands in which the frequency of the first signal can lie;

(b) the second signal is transmitted into one of the frequency bands at a time; and (c) the second signal is transmitted into different frequency bands at different times according to the first temporal transmission pattern;

wherein B is an integer greater than 1; and wherein $R_{min}$ and $R_{max}$ are positive real numbers and $R_{min}<R_{max}$.

13. The method of claim 12 further comprising:

generating a second temporal transmission pattern that is based on $R_{min}$, $R_{max}$, and B;

transmitting a third signal for jamming the first signal, wherein the third signal is transmitted into one of the frequency bands at a time, and wherein the third signal is transmitted into different frequency bands at different times according to the second temporal transmission pattern.

14. The method of claim 12 wherein the description further comprises:

(iv) a minimum length, $N_b$, of a message that is part of the first signal, and (v) a minimum size, $N_o$, of a portion of the message, the portion to be overlapped by the second signal;

wherein the first temporal transmission pattern is also based on $N_b$ and $N_o$.

15. The method of claim 14 wherein a duration, $L_w$, of an uninterrupted interval of time that the second signal spends in a frequency band as part of the first temporal transmission pattern, satisfies the inequality $L_w B \leqq N_b/R_{max}$.

16. The method of claim 14 wherein a duration, $L_w$, of an uninterrupted interval of time that the second signal spends in a frequency band as part of the first temporal transmission pattern, satisfies the inequality $L_w \geqq N_o/R_{max}$.

17. The method of claim 14 wherein a duration, $L_w$, of an uninterrupted interval of time that the second signal spends in a frequency band as part of the first temporal transmission pattern, satisfies the inequality $L_w B \leqq N_b/(R_{min} N_o)$.

18. The method of claim 14 wherein the description further comprises:

(vi) a minimum fraction, f, of a symbol, the minimum fraction to be overlapped by the second signal;

wherein the first temporal transmission pattern is also based on f.

19. The method of claim 18 wherein a duration, $L_w$, of an uninterrupted interval of time that the second signal spends in a frequency band as part of the first temporal transmission pattern, satisfies the four inequalities: $L_w B \leqq N_b/R_{max}$; $L_w \geqq N_o/R_{max}$; $L_w \geqq f/R_{min}$; $L_w B \leqq N_b/(R_{min} N_o)$.

20. The method of claim 18 wherein a duration, $L_w$, of an uninterrupted interval of time that the second signal spends in a frequency band as part of the first temporal transmission pattern, satisfies the four inequalities: $L_w B_1 \leqq N_b/R_{max1}$; $L_w \geqq N_o/R_{max1}$; $L_w \geqq f/R_{min1}$; $L_w B_1 \leqq N_b/(R_{min1} N_o)$;

wherein the three parameters $R_{min1}$, $R_{max1}$, and $B_1$ satisfy the inequalities: $R_{min} \leqq R_{min1} \leqq R_{max1} \leqq R_{max}$ and $1 \leqq B_1 \leqq B$.

21. The method of claim 18 wherein generating the first temporal transmission pattern comprises:

(a) setting a time interval duration, $L_w$, equal to $f/R_{min}$;

(b) setting a number of bands, $B_1$, equal to the least of B and $N_b/N_o$;

(c) setting an intermediate maximum baud value, $R_{max1}$, equal to the least of $R_{max}$ and $N_b/(L_w B_1)$;

(d) specifying, as part of the first temporal transmission pattern, a first transmission of the second signal into a first frequency band for a length of time equal to $L_w$;

(e) specifying, as part of the first temporal transmission pattern, a second transmission of the second signal into a second frequency band for a length of time equal to $L_w$, immediately following the first transmission;

(f) specifying, as part of the first temporal transmission pattern, that the sequence of first transmission and second transmission is to be repeated periodically.

22. The method of claim 21 wherein a duration, $L_w$, of an uninterrupted interval of time that the second signal spends in a frequency band as part of the first temporal transmission pattern, satisfies the inequality $L_w \geqq f/R_{min}$.

23. The method of claim 12 wherein the description further comprises:

(iv) a minimum fraction, f, of a symbol, the minimum fraction to be overlapped by the second signal;

wherein the first temporal transmission pattern is also based on f.

* * * * *